United States Patent
Suzaki et al.

(10) Patent No.: US 12,488,999 B2
(45) Date of Patent: Dec. 2, 2025

(54) SUBSTRATE PROCESSING APPARATUS, CLEANING METHOD, AND METHOD OF MANUFACTURING SEMICONDUCTOR DEVICE

(71) Applicant: Kokusai Electric Corporation, Tokyo (JP)

(72) Inventors: Kenichi Suzaki, Toyama (JP); Yuma Ikeda, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 604 days.

(21) Appl. No.: 17/945,633

(22) Filed: Sep. 15, 2022

(65) Prior Publication Data

US 2023/0096542 A1    Mar. 30, 2023

(51) Int. Cl.
*H01L 21/67*        (2006.01)
*H01L 21/02*        (2006.01)

(52) U.S. Cl.
CPC .... *H01L 21/67063* (2013.01); *H01L 21/0206* (2013.01)

(58) Field of Classification Search
CPC ................................................ H01L 21/67063
See application file for complete search history.

(56) References Cited

U.S. PATENT DOCUMENTS

| | | |
|---|---|---|
| 2019/0094833 A1 | 3/2019 | Aizawa et al. |
| 2020/0090965 A1 | 3/2020 | Miyashita et al. |
| 2020/0165722 A1 | 5/2020 | Saido et al. |
| 2021/0087678 A1 | 3/2021 | Ebata et al. |

FOREIGN PATENT DOCUMENTS

| | | |
|---|---|---|
| JP | 2007-073746 A | 3/2007 |
| JP | 2008-078285 A | 4/2008 |
| JP | 2010-021385 A | 1/2010 |
| JP | 2010-053393 A | 3/2010 |
| JP | 2018-022773 A | 2/2018 |
| JP | 2020-035779 A | 3/2020 |
| JP | 2020-047911 A | 3/2020 |
| JP | 2021-052092 A | 4/2021 |
| WO | 2019/044013 A1 | 3/2019 |

OTHER PUBLICATIONS

Japanese Office Action issued on Apr. 18, 2023 for Japanese Patent Application No. 2021-155568.
Communication Pursuant to Article 94(3) EPC issued on Feb. 15, 2024 for European Patent Application No. 22195393.8.

*Primary Examiner* — Jason Y Ko
(74) *Attorney, Agent, or Firm* — Volpe Koenig

(57) ABSTRACT

There is provided a technique that includes a reaction container configured to process a substrate; a cleaning gas supply system configured to supply a cleaning gas into the reaction container; a lid configured to be capable of closing an opening of the reaction container and made of a metallic material; a protector installed over a surface of the lid at a side facing an inside of the reaction container and including a surface composed of a first non-metallic material; an internal space formed between surfaces of the lid and the protector facing each other; and an inert gas supply system configured to supply an inert gas to the internal space in a state in which the opening is closed by the lid.

18 Claims, 9 Drawing Sheets

US 12,488,999 B2

SUBSTRATE PROCESSING APPARATUS, CLEANING METHOD, AND METHOD OF MANUFACTURING SEMICONDUCTOR DEVICE

CROSS-REFERENCE TO RELATED APPLICATION

This application is based upon and claims the benefit of priority from Japanese Patent Application No. 2021-155568, filed on Sep. 24, 2021, the entire contents of which are incorporated herein by reference.

TECHNICAL FIELD

The present disclosure relates to a substrate processing apparatus, a cleaning method, and a method of manufacturing a semiconductor device.

BACKGROUND

In recent years, in a semiconductor device manufacturing process, there is a demand for a film-forming method that generates less foreign substances. Regarding a control of foreign substances, as one method, a method may be performed to remove a film deposited on an inner wall of a reaction tube or the like by gas cleaning without detaching the reaction tube.

However, in a cleaning process using a cleaning gas, a surface of a component including a metallic material may react with the cleaning gas, which may cause corrosion or deterioration of the surface of the component.

SUMMARY

Some embodiments of the present disclosure provide a technique capable of preventing a cleaning gas from coming into contact with a surface of a lid including a metallic material and suppressing generation of corrosion or deterioration of the surface of the lid.

According to one embodiment of the present disclosure, there is provided a technique that includes a reaction container configured to process a substrate; a cleaning gas supply system configured to supply a cleaning gas into the reaction container; a lid configured to be capable of closing an opening of the reaction container and made of a metallic material; a protector installed over a surface of the lid at a side facing an inside of the reaction container and including a surface composed of a first non-metallic material; an internal space formed between surfaces of the lid and the protector facing each other; and an inert gas supply system configured to supply an inert gas to the internal space in a state in which the opening is closed by the lid.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
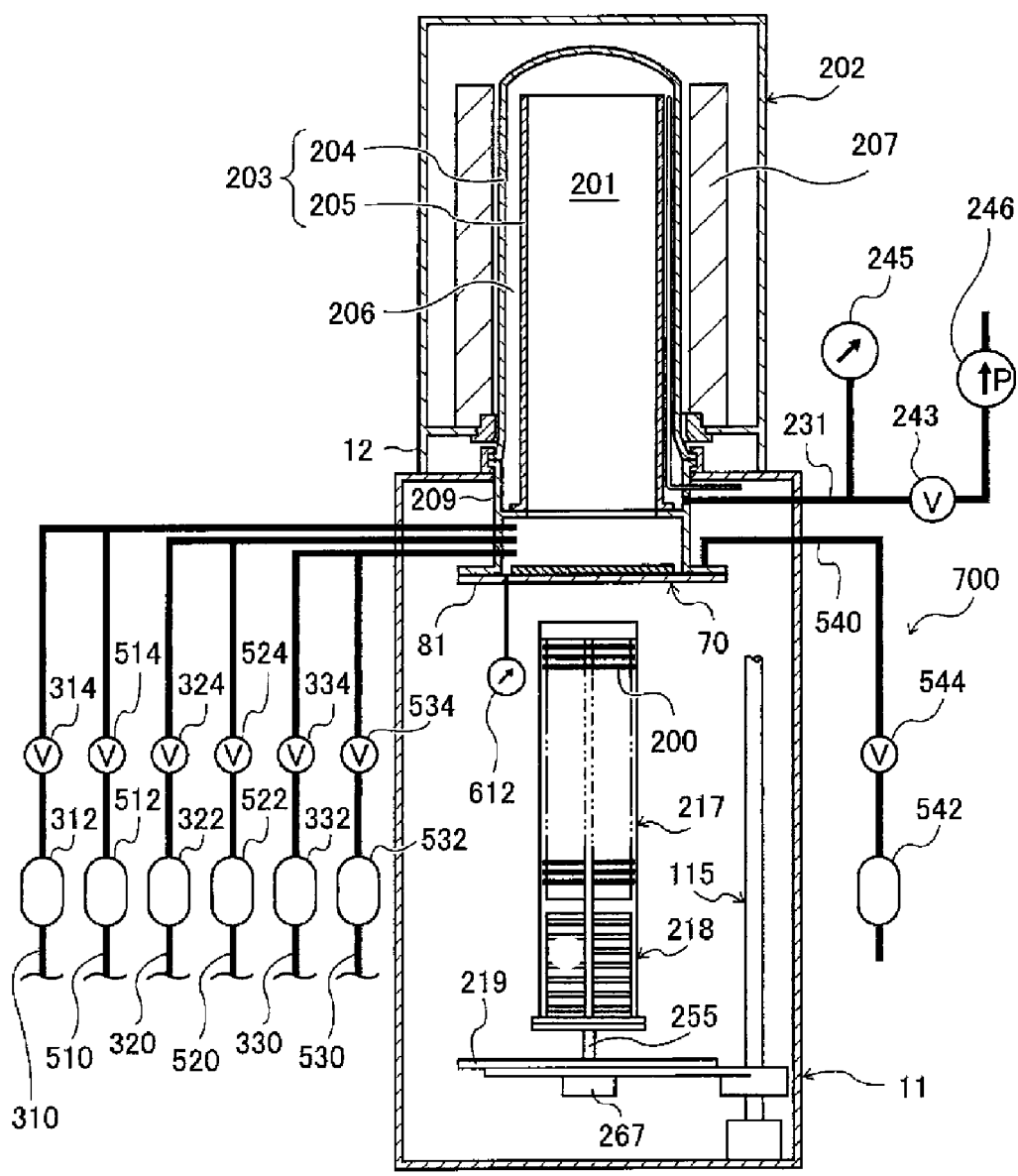
FIG. 1 is a vertical sectional view showing a state in which a reaction container is closed by a lid with a substrate support unloaded from an inside of the reaction container in a substrate processing apparatus according to the present disclosure (during a cleaning step).

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, description will be made with reference to FIGS. 1 to 7. It should be noted that the drawings used in the following description are all schematic and the dimensional relationship between the respective elements, the ratio of the respective elements, and the like shown in the drawings do not always match the actual ones. Further, the dimensional relationship between the respective elements, the ratio of the respective elements, and the like do not always match even between the drawings.

(1) Configuration of Substrate Processing Apparatus

Figure 2:
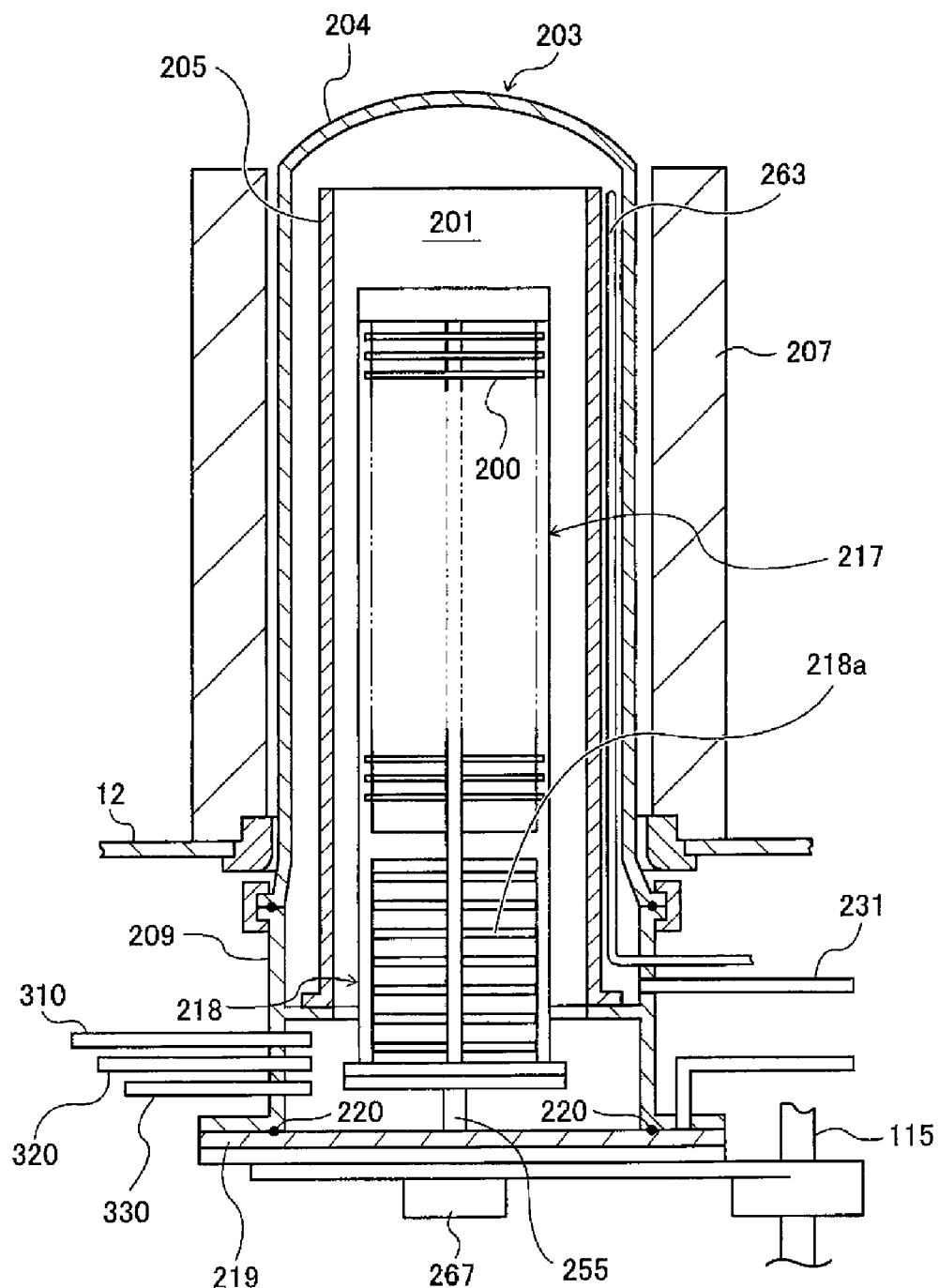
FIG. 2 is a vertical sectional view showing a state in which the reaction container is closed by a seal cap with the substrate support charged with substrates loaded into the reaction container (during a film-forming step).

FIG. 1 is a vertical sectional view showing a state in which a reaction container is closed by a lid with a substrate support unloaded from an inside of the reaction container in a substrate processing apparatus according to the present disclosure (during a cleaning step). FIG. 2 is a vertical sectional view showing a state in which the reaction container is closed by a seal cap with the substrate support charged with substrates loaded into the reaction container (during a film-forming step).

As shown in FIG. 1, the substrate processing apparatus 10 includes a housing 11 formed in a rectangular cuboid shape and a process furnace 202 is installed on the housing 11 via a heater base 12 as a support plate. The process furnace 202 includes a heater 207 as a heating mechanism (heating means). The heater 207 is formed in a cylindrical shape and is vertically installed by being supported by the heater base 12 as the support plate.

Inside the heater 207, a process tube 203 as a reaction tube is arranged concentrically with the heater 207. The process tube 203 includes an outer tube 204 as an external reaction tube and an inner tube 205 as an internal reaction tube installed inside the outer tube 204. The outer tube 204 is made of a heat-resistant material such as quartz ($SiO_2$), silicon carbide (SiC) or the like. The outer tube 204 has an inner diameter larger than an outer diameter of the inner tube 205. The outer tube 204 is formed in a cylindrical shape with an upper end of the outer tube 204 closed and a lower end of the outer tube 204 opened, and is installed concentrically with the inner tube 205.

The inner tube 205 is made of a heat-resistant material such as quartz, SiC or the like, and is formed in a cylindrical shape with upper and lower ends of the inner tube 205 opened. A process chamber 201 is formed in a hollow of the inner tube 205 and is configured to be capable of accommodating wafers 200 as substrates in a state in which the wafers 200 are vertically arranged in multiple stages in a horizontal posture on a boat described later.

Below the outer tube 204, a manifold 209 is arranged concentrically with the outer tube 204. The manifold 209 is made of, for example, stainless steel or the like, and is formed in a cylindrical shape with upper and lower ends of the manifold 209 opened. The manifold 209 is engaged with the inner tube 205 and the outer tube 204, and is installed to support the inner tube 205 and the outer tube 204. Since the manifold 209 is supported by the heater base 12, the process tube 203 is in a vertically installed state. The reaction container that processes the wafers 200 is formed by the process tube 203 and the manifold 209. An O-ring as a gasket is installed between the manifold 209 and the outer tube 204.

The manifold 209 is installed with an exhaust pipe 231 as a line that exhausts an atmosphere in the process chamber 201. The exhaust pipe 231 is arranged at a lower end portion of a tubular space 206 formed by a gap between the inner tube 205 and the outer tube 204, and communicates with the tubular space 206. On a downstream side of the exhaust pipe 231 opposite to a side on which the exhaust pipe 231 is connected to the manifold 209, a pressure sensor 245 as a pressure detector, an APC (Auto Pressure Controller) valve 243 as an exhaust valve (pressure regulator), and a vacuum pump 246 as an vacuum-exhauster are installed and configured to be capable of exhausting the process chamber 201 with vacuum so that a pressure in the process chamber 201 becomes a predetermined pressure (degree of vacuum).

The APC valve 243 is configured so that vacuum-exhaust of an interior of the process chamber 201 and a stop of the vacuum-exhaust can be performed by opening and closing valve in a state in which the vacuum pump 246 is operated, and so that a pressure inside the process chamber 201 can be regulated by adjusting a degree of valve opening based on a pressure information detected by the pressure sensor 245 in the state in which the vacuum pump 246 is operated. An exhaust system mainly includes the exhaust pipe 231, the APC valve 243, and the pressure sensor 245. The vacuum pump 246 may be included in the exhaust system.

Below the manifold 209, the seal cap 219 is installed as a furnace opening lid that airtightly closes a lower end opening of the manifold 209. As shown in FIG. 2, the seal cap 219 comes into contact with the lower end of the manifold 209 from a lower side in a vertical direction. The seal cap 219 is made of a metal such as stainless steel or the like and is formed in a disk shape. An O-ring 220 as a gasket that comes into contact with the lower end (opening end) of the manifold 209 is installed on an upper surface of the seal cap 219.

The seal cap 219 is configured to be vertically raised and lowered by a boat elevator 115 as an elevating mechanism vertically installed outside the process tube 203, whereby the boat described later can be loaded into and unloaded from the process chamber 201.

A rotator 267 that rotates the boat is installed on an opposite side of the seal cap 219 from the process chamber 201. The rotary shaft 255 of the rotator 267, which penetrates the seal cap 219, is connected to the boat 217 described later and is configured to rotate the wafers 200 by rotating the boat 217.

The boat 217 as a substrate holder is configured to hold a plurality of wafers 200 in the horizontal posture in multiple stages with centers of the wafers 200 aligned with each other. Further, below the boat 217, a heat insulating plate holder 218 having the same shape as the boat 217 is installed to support the boat 217 and a plurality of heat insulating plates 218a as heat insulators are supported in a horizontal posture in multiple stages. The heat insulating plates 218a are formed in a disk shape by using a heat-resistant material such as quartz, SiC or the like, and is configured so that heat of the heater 207 is not easily transferred to a side of the manifold 209.

A temperature sensor 263 as a temperature detector is installed in the process tube 203.

Gas supply pipes 310, 320, and 330 that supply gases into the process chamber 201 are installed in the manifold 209.

On the gas supply pipes 310, 320, and 330, mass flow controllers (MFCs) 312, 322, and 332, which are flow controllers (flow control parts), and valves 314, 324, and 334, which are on-off valves, are installed sequentially from an upstream side, respectively. Gas supply pipes 510, 520, and 530 that supply an inert gas are connected on a downstream side of the valves 314, 324, and 334 of the gas supply pipes 310, 320, and 330, respectively. On the gas supply pipes 510, 520, and 530, MFCs 512, 522, and 532, which are flow rate controllers (flow control parts), and valves 514, 524, and 534, which are on-off valves, are installed sequentially from an upstream side, respectively.

From the gas supply pipe 310, a precursor gas, which is a processing gas and a film-forming gas, is supplied to the process chamber 201 through the MFC 312 and the valve 314. A precursor gas supply system mainly includes the gas supply pipe 310, the MFC 312, and the valve 314. The precursor gas supply system may also be referred to as a precursor supply system.

From the gas supply pipe 320, a reaction gas as a processing gas and a film-forming gas is supplied into the process chamber 201 through the MFC 322 and the valve 324. A reaction gas supply system (reactant supply system) mainly includes the gas supply pipe 320, the MFC 322, and the valve 324.

From the gas supply pipe 330, a cleaning gas (etching gas) as a processing gas is supplied into the process chamber 201 through the MFC 332 and the valve 334. A cleaning gas supply system mainly includes the gas supply pipe 330, the MFC 332, and the valve 334.

From the gas supply pipes 510, 520, and 530, the inert gas is supplied to the process chamber 201 through the MFCs 512,522, and 532 and the valves 514,524, and 534.

As the inert gas, for example, a nitrogen ($N_2$) gas and a rare gas such as an argon (Ar) gas, a helium (He) gas, a neon (Ne) gas, a xenon (Xe) gas or the like may be used. One or more of these gases may be used as the inert gas. This point holds true for other inert gases described later.

An inert gas supply system mainly includes the gas supply pipes 510, 520, and 530, the MFCs 512, 522, and 532, and the valves 514, 524, and 534. In FIGS. 1 and 2, for the sake of convenience, the gas supply pipes 310, 320, and 330 are shown to be arranged in the vertical direction, however, the gas supply pipes 310, 320, and 330 are actually arranged in a circumferential direction.

Next, detailed structure around a shutter 81 in a state in which the boat 217 is unloaded from the process tube 203 and an opening of the manifold 209 is closed by the shutter 81 as the lid will be described with reference to FIGS. 1 and 3 to 6.

As shown in FIG. 1, a shutter device 70 that closes the lower end opening of the manifold 209 in a state in which the boat 217 is unloaded from the process chamber 201 is installed in the housing 11.

Figure 3:
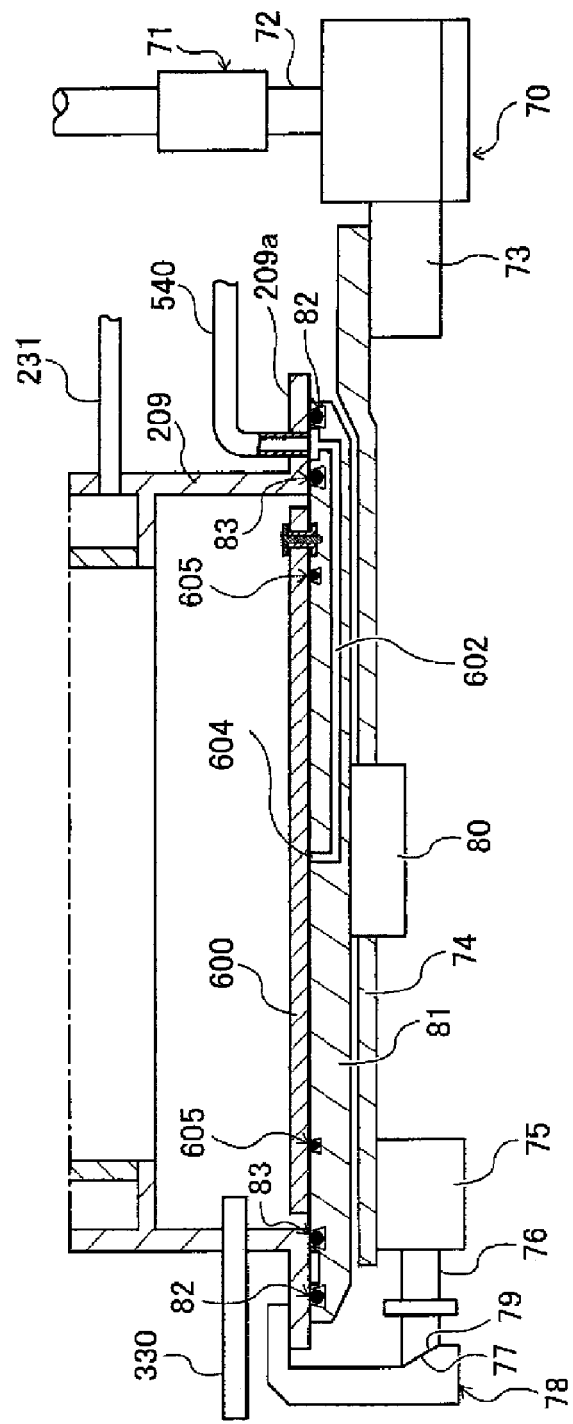
FIG. 3 is a vertical sectional view showing surroundings of the lid in FIG. 1.

As shown in FIG. 3, the shutter device 70 includes a rotary actuator 71 which is installed at a ceiling wall of the housing 11 to face vertically downward. An arm 73 is fixed to a rotary shaft 72 of the rotary actuator 71 to rotate in a horizontal plane, and a base 74 is horizontally supported at a free end of the arm 73 to rotate integrally. A cylinder 75 included in a clamp is installed radially outward around the base 74, and an inclined surface 77 is formed at a tip of a piston rod 76 of the cylinder 75.

The inclined surface 77 faces an inclined surface 79 of a fixed side 78 fixed to the manifold 209. The shutter 81 is horizontally arranged over the base 74 and is floatingly supported (independently suspended) by a spring 80. Further, if the piston rod 76 of the cylinder 75 extends radially outward, since the inclined surface 77 slides on the inclined surface 79 of the fixed side 78, so that the base 74 comes into a relatively raised state, thus, the base 74 clamps the shutter 81 by abutting (pushing) the shutter 81 against a lower surface of the manifold 209 via the spring 80. That is, the shutter 81 is configured to abut against the opening end of the manifold 209, which is an opening end of the reaction container, to close the opening of the manifold 209, which is an opening of the reaction container. The shutter 81 is made of a metallic material.

Figure 4:
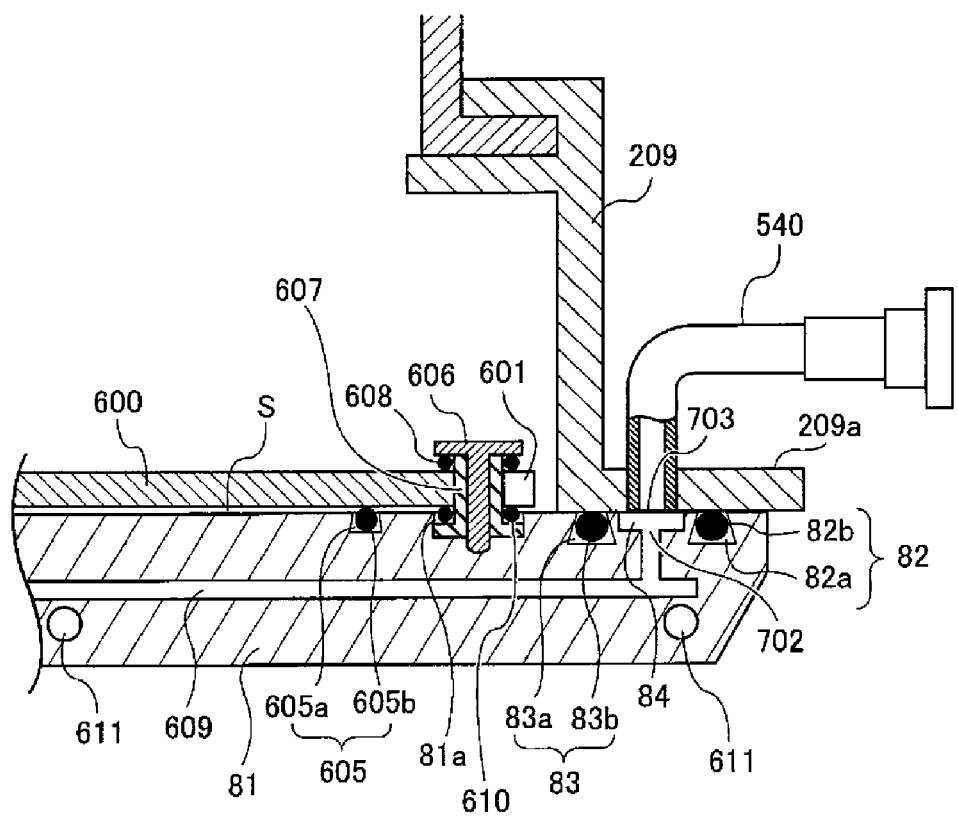
FIG. 4 is a vertical sectional view showing surroundings of a contact surface between an opening end of the reaction container and the lid.

As shown in FIGS. 3 and 4, the opening end that is a lower end of the manifold 209 is provided by a lower flange 209a. On a contact surface of an upper surface of the shutter 81 in contact with the lower flange 209a, a dovetail groove 82a is formed along an outer periphery of the shutter 81 over an entire circumference of the shutter 81, and an O-ring 82b as a second gasket is installed in the dovetail groove 82a. Further, on the contact surface of the upper surface of the shutter 81 in contact with the lower flange 209a and on an inner peripheral side of the O-ring 82b, a dovetail groove 83a is formed along the outer periphery of the shutter 81 over the entire circumference of the shutter 81, and an O-ring 83b as a third gasket is installed in the dovetail groove 83a. The O-ring 82b and the dovetail groove 82a are used as a second seal 82 sealing a gap between the shutter 81 and the lower flange 209a. Further, the O-ring 83b and the dovetail groove 83a are used as a third seal 83 that seals the gap between the shutter 81 and the lower flange 209a. That is, the gap between the shutter 81 and the lower end of the manifold 209 is airtightly sealed by the second seal 82 and the third seal 83 in a state in which the opening is closed by the shutter 81. In the following description, the O-ring will be described as being made of a heat-resistant elastic material such as a fluorine-based resin or the like.

A plate 600 as a protector is installed over the upper surface of the shutter 81. That is, the plate 600 is installed over a surface of the shutter 81 at a side facing the inside of the reaction container (i.e., inside of the process tube 203 and the manifold 209) in the state in which the opening of the reaction container (i.e., the opening of the manifold 209) is closed by the shutter 81.

Figure 5:
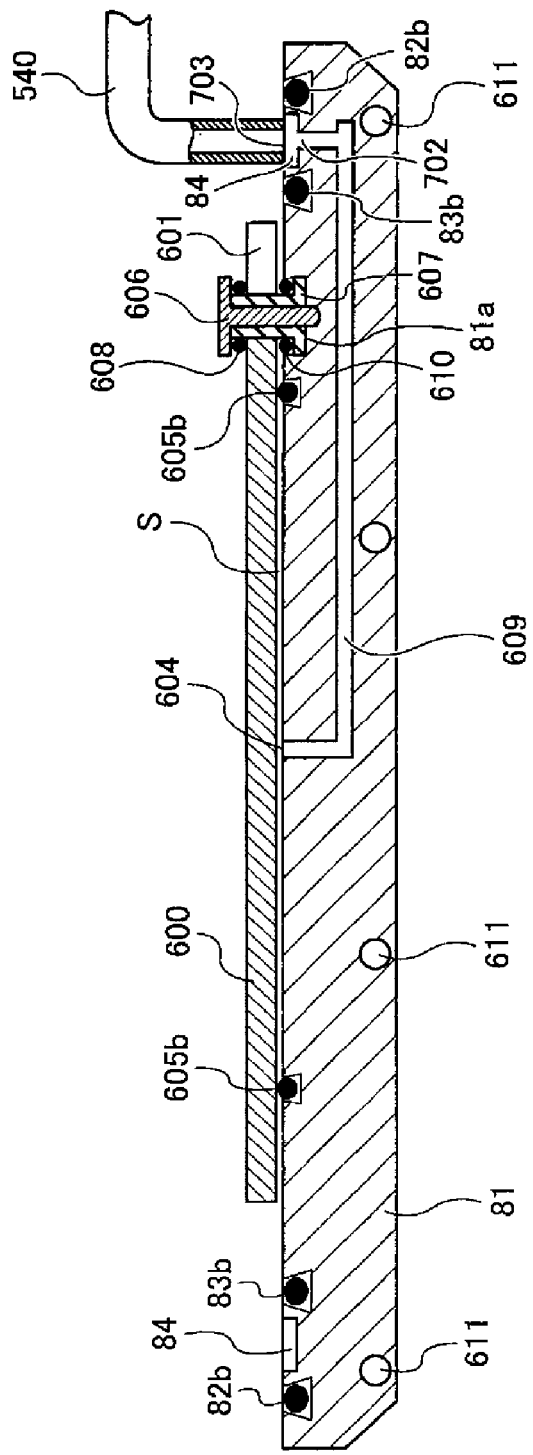
FIG. 5 is a vertical sectional view showing the lid that closes an opening of the reaction container.

As shown in FIGS. 4 and 5, an internal space S is formed between surfaces of the shutter 81 and the plate 600 facing each other.

Further, a gas introduction port 702 is installed at the contact surface of the upper surface of the shutter 81 in contact with the opening end that is a lower end of the manifold 209 and, in other words, the gas introduction port 702 is installed at the contact surface of the shutter 81 in contact with the lower flange 209a.

Further, an annular groove 84 communicating with the gas introduction port 702 is formed at a portion of the upper surface of the shutter 81 surrounded by the O-ring 82b and the O-ring 83b. The annular groove 84 is formed in an annular shape along the outer periphery of the shutter 81. That is, the annular groove 84 is formed in the portion of the contact surface of the upper surface of the shutter 81 in contact with the lower flange 209a, the portion is surrounded by the O-ring 82b and the O-ring 83b. Further, the annular groove 84 is installed inside the O-ring 82b when viewed from a center of the manifold 209, and is installed outside the O-ring 83b when viewed from the center of the manifold 209. By the second seal 82, leakage of the inert gas supplied into the annular groove 84 can be suppressed. Further, by the third seal 83, it is possible to more reliably prevent the cleaning gas in the furnace from leaking through the contact surface.

Further, a first gas supply port 604 communicating with the internal space S is formed at substantially a center of a surface of the shutter 81 facing the internal space S. Further, a gas flow path 609 that connects the gas introduction port 702 and the first gas supply port 604 is installed in the shutter 81. That is, one end of the gas flow path 609 communicates with the gas introduction port 702, and the other end of the gas flow path 609 communicates with the first gas supply port 604. That is, the annular groove 84, the gas introduction port 702, the gas flow path 609, and the first gas supply port 604 communicate with each other, so that a gas supplied from a second gas supply port 703, which will be described later, is supplied to the internal space S through the annular groove 84, the gas introduction port 702, the gas flow path 609, and the first gas supply port 604.

Further, a gas supply pipe 540 that supplies the inert gas penetrates through the lower flange 209a, and a second gas supply port 703 is installed at a contact surface of the lower flange 209a in contact with the shutter 81. The second gas supply port 703 and the gas introduction port 702 are arranged to be connected and communicate with each other through the annular groove 84 in the state in which the opening of the manifold 209 is closed. That is, the second gas supply port 703 is connected to the gas introduction port 702 in a state in which the shutter 81 and the lower flange 209a come into contact with each other and the opening is closed by the shutter 81. This makes it possible to supply the inert gas into the internal space S via the movable shutter 81. Further, the contact surface is purged by the inert gas introduced into the annular groove 84, and leakage of the cleaning gas can be suppressed. Further, in this embodiment, an example in which the second gas supply port 703 and the gas introduction port 702 are installed at mutually facing positions has been described, however, the second gas supply port 703 and the gas introduction port 702 may be installed at mutually different positions in the circumferential direction of the shutter 81 through the annular groove 84.

Figure 6:
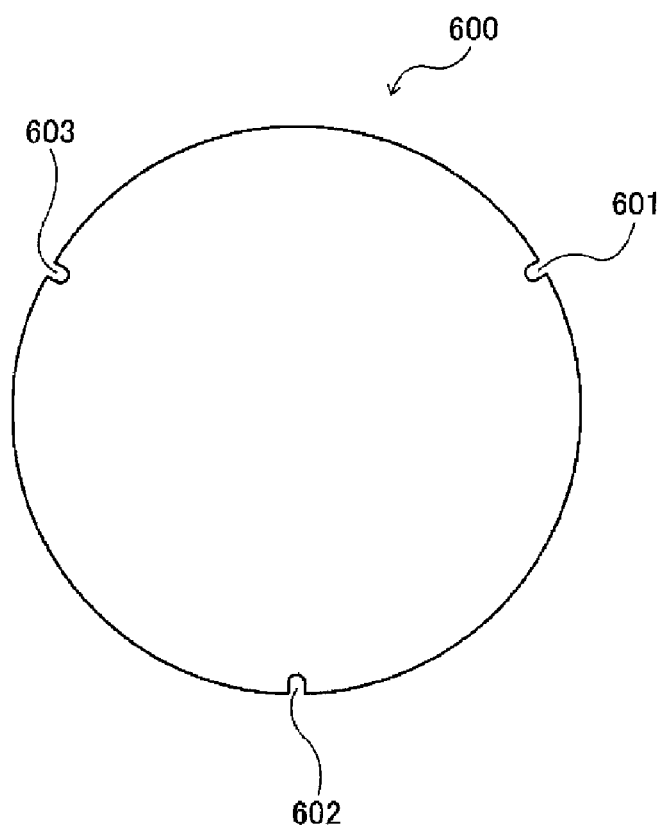
FIG. 6 is a diagram showing a protector installed over an upper surface of the lid.

As shown in FIG. 6, the plate 600 is a circular flat plate, and notches 601, 602, and 603 cut in an arc shape toward a center of the plate 600 are formed at an outer peripheral end of the plate 600. The plate 600 is made of a first non-metal material. In this regard, the first non-metallic material is a material that does not react with the cleaning gas. The plate 600 is made of the first non-metallic material such as quartz or SiC. As a result, it is possible to suppress an occurrence of corrosion of the plate 600. When, for example, a fluorine (F)-containing gas is used as the cleaning gas, it is preferable to use the plate 600 made of quartz. This is because the F-containing gas may react with SiC to cause corrosion or the like. On the other hand, when it is necessary to increase a pressure difference between the reaction container inside the process tube 203 and the internal space S, it is preferable to use the plate 600 made of SiC, which has higher mechanical strength than quartz. That is, it is preferable to determine a material of the plate 600 depending on the cleaning gas used and processing conditions. It is also preferable to determine a thickness of the plate 600 depending on desired pressure difference to have required mechanical strength.

A recess (counterbore) 81a is formed on the upper surface of the shutter 81 at a position where the plate 600 is fixed. Then, notches 601 to 603 of the plate 600 are arranged at corresponding positions of the recess 81a of the shutter 81. Then, a holder 607 is arranged in the recess 81a, O-rings 610, and 608 which are elastic bodies are attached to an outer periphery of the holder 607, and the plate 600 is arranged between the O-ring 610 and the O-ring 608. And then, the plate 600 is fixed to the shutter 81 by inserting a fixing member 606 inside the holder 607.

That is, the plate 600 is fixed to the shutter 81 by screwing or the like with the fixing member 606 via the holder 607. Thus, when fixing with the fixing member 606, it becomes easy to adjust tightening amount to a predetermined value. That is, it becomes easy to make a gap width between the plate 600 and the shutter 81 constant. That is, the plate 600 is configured to be fixed to the shutter 81 while maintaining communication between the internal space S and the space inside the reaction container (i.e., inside the process tube 203 and the manifold 209).

The fixing member 606 is configured to fix the plate 600 to the shutter 81 in a state in which the O-ring 610 installed at the outer periphery of the holder 607 is sandwiched between the plate 600 and the shutter 81. As a result, it is possible to prevent the plate 600 from being damaged when the fixing member 606 is used for fixing. Further, it becomes easy to adjust the fixing member 606 to have a predetermined tightening amount. Moreover, by fixing the plate 600 with the fixing member 606, it is possible to increase a pressure in the internal space S while preventing the plate 600 from floating when the inert gas is supplied into the internal space S.

As the fixing member 606, for example, a screw or a bolt may be used. As the holder 607, for example, a spacer or a collar may be used. The fixing member 606 is made of a second non-metallic material, for example, a heat-resistant resin such as a fluorine-based resin, a polyimide resin, or the like. Further, as the fixing member 606, a member including a surface coated with the second non-metallic material may be used. Moreover, it is desirable that the holder 607 is also made of the second non-metallic material just like the fixing member 606. This makes it possible to suppress corrosion, deterioration, and the like of the fixing member 606 and the holder 607 due to the cleaning gas. Further, since the O-ring 610 is arranged in contact with the shutter 81 on a lower surface side of the plate 600, the temperature of the O-ring 610 does not become high as compared with the O-ring 608, and the O-ring 610 is less likely to deteriorate. Therefore, it is possible to use only the O-ring 610 without using the O-ring 608.

A dovetail groove 605a is formed at an inner peripheral side of the O-ring 83b on the upper surface of the shutter 81 and at a further inner peripheral side of a fixing position of the fixing member 606 on the surface of the shutter 81 facing the plate 600. An O-ring 605b as a first gasket is installed in the dovetail groove 605a. Then, a space between the shutter 81 and the plate 600 is sealed by the O-ring 605b. The O-ring 605b and the dovetail groove 605a are used as a first seal 605 that seals a gap between the shutter 81 and the plate 600. The O-ring 605b is installed along the outer periphery of the plate 600 over the entire circumference of the shutter 81. The internal space S is configured (defined) by a space surrounded by mutually facing surfaces of the shutter 81 and the plate 600, and the O-ring 605b. Then, the pressure in the internal space S is increased to more reliably prevent the cleaning gas from entering the internal space S. Further, as will be described later, the first seal 605 does not completely seal the internal space S, and is configured so that as an internal pressure of the internal space S increases, the inert gas in the internal space S flows into the reaction container.

A wire diameter (thickness) of the O-ring 605b is different from wire diameters of the O-rings 82b and 83b arranged outside the O-ring 605b. Specifically, the wire diameter of the O-ring 605b is smaller than the wire diameters (thicknesses) of the O-ring 82b and the O-ring 83b. In other words, a wire diameter becomes smaller as O-rings are installed more inward (also referred to as center side) in the reaction container. Since the plate 600 and the fixing member 606 are made of a non-metallic material, pressing pressure is relatively small. That is, it is preferable that the wire diameter of the O-ring 605b is relatively small so that the O-ring 605b can be easily crushed with a small pressure. Further, in order not to completely block a flow of the inert gas, it is desirable that sealing force of the O-ring 605b is weaker than sealing force of the O-ring 82b and the O-ring 83b, and crushing rate (deformation rate) of the O-ring 605b is smaller than crushing rate of the O-ring 82b and the O-ring 83b. Specifically, for example, when the crushing rate of the O-ring 82b at a time of vacuum-contact is 20%, the crushing rate of the O-ring 83b is set to 10% and the crushing rate of the O-ring 605b is set to 0%. Therefore, the inert gas supplied to the internal space S is not completely blocked, then when a pressure difference between the internal space S and the process chamber 201 becomes large, the inert gas is circulated in the reaction container through a gap between the O-ring 605b and the plate 600 and/or between the O-ring 605b and the shutter 81. This makes it possible to more reliably suppress an entry of the cleaning gas into the internal space S.

Below the gas flow path 609 in the shutter 81, a refrigerant flow path 611 that supplies a refrigerant such as a cooling gas or the like that cools the shutter 81 and surroundings of the shutter 81 is installed. The refrigerant flow path 611 is continuously installed in the circumferential direction. By cooling the shutter 81 and the surroundings of the shutter 81 in this way, it is possible to suppress damage to the shutter 81 and the O-rings mounted around the shutter 81. As the refrigerant, for example, the inert gas can be used. In this regard, the refrigerant may be a gas such as the inert gas or the like, or a liquid such as water or the like, and may be appropriately used.

As shown in FIG. 1, at the other end of the gas supply pipe 540, an MFC 542, and a valve 544 are installed sequentially from an upstream side. From the gas supply pipe 540, the inert gas as a purge gas is supplied to the internal space S between the shutter 81 and the plate 600 through the MFC 542 and the valve 544. An inert gas supply system 700 that supplies the inert gas to the internal space S mainly includes the gas supply pipe 540, the MFC 542, and the valve 544. That is, the inert gas supply system 700 is configured to supply the inert gas to the internal space S through the first gas supply port 604 in the state in which the opening is closed by the shutter 81.

A pressure sensor 612 as a pressure detector is installed in the internal space S, and the inert gas supply system 700 is configured to be controlled based on a pressure detected by the pressure sensor 612 so that the pressure in the internal space S becomes a predetermined pressure at which the inert gas supplied into the internal space S flows into the reaction container (i.e., the inside of the process tube 203 and the manifold 209) through the gap between the O-ring 605b and the plate 600. In other words, the inert gas supply system 700 is controlled to set a pressure at which the cleaning gas does not enter the internal space S. The pressure sensor 612 may be installed in the gas supply pipe 540 instead of the internal space S.

Figure 7:
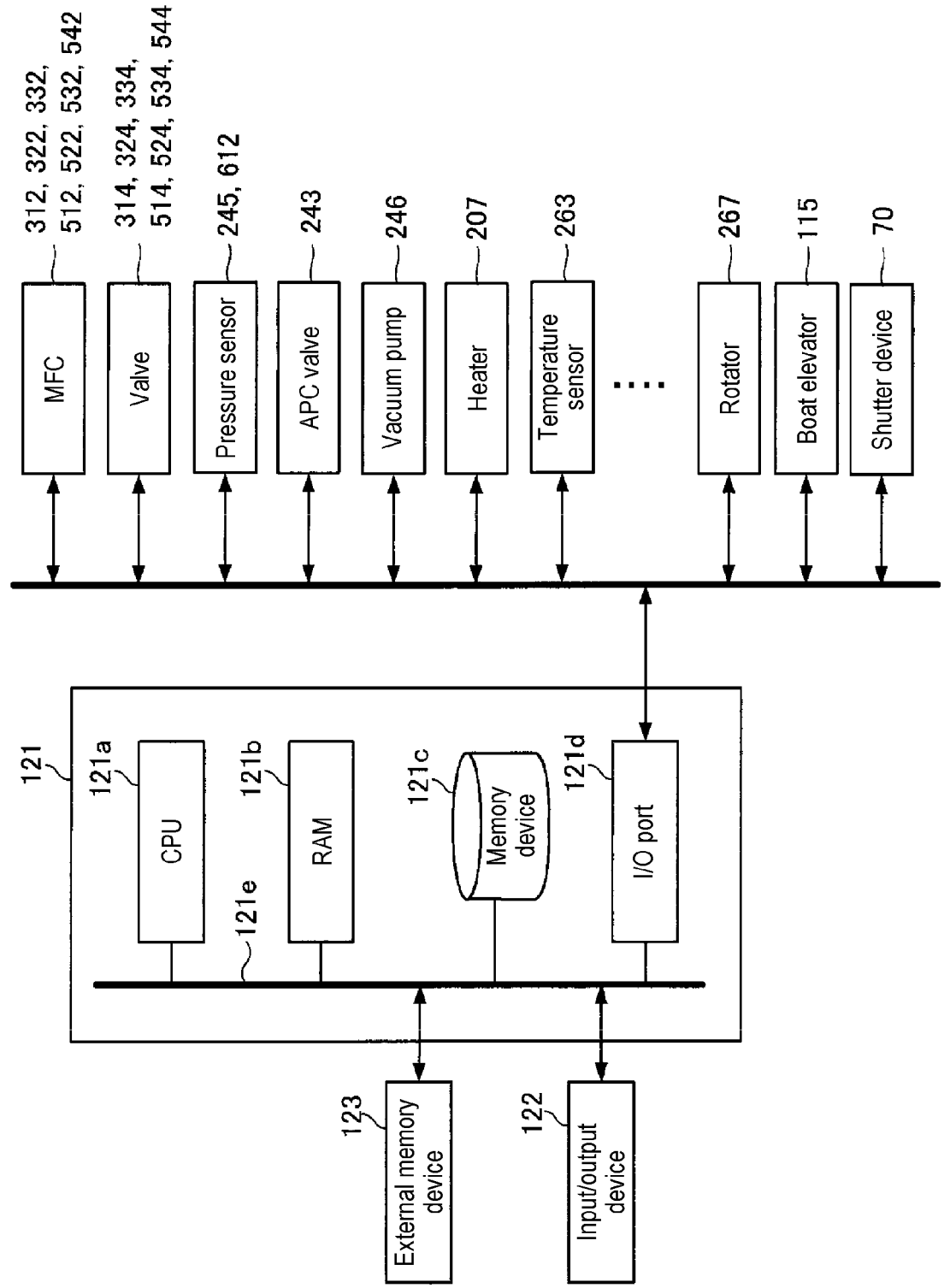
FIG. 7 is a schematic configuration diagram of a controller of a substrate processing apparatus according to one aspect of the present disclosure, in which a control system of the controller is shown in a block diagram.

As shown in FIG. 7, the controller 121, which is a control part (control means), is configured as a computer including a CPU (Central Processing Unit) 121a, a RAM (Random Access Memory) 121b, a memory device 121c, and an I/O port 121d. The RAM 121b, the memory device 121c and the I/O port 121d are configured to be capable of exchanging data with the CPU 121a via an internal bus. An input/output device 122 configured as, for example, a touch panel or the like is connected to the controller 121.

The memory device 121c includes, for example, a flash memory, an HDD (Hard Disk Drive), or the like. The memory device 121c readably stores at least one selected from the group of a control program that controls the temperature of a liquid precursor, a control program that controls the operation of the substrate processing apparatus, a process recipe describing the procedure and conditions of a semiconductor device manufacturing method described later, and the like. The process recipe is configured to obtain a predetermined result by causing the controller 121 as a computer to have the substrate processing apparatus execute each process (each step) in a semiconductor device manufacturing method described later. The process recipe functions as a program. Hereinafter, the process recipe, the control program, and the like are collectively and simply referred to as a program. When the term program is used herein, it may include only a process recipe, only a control program, or a combination of a process recipe and a control program. The RAM 121b is configured as a memory area (work area) in which programs, data, and the like read by the CPU 121a are temporarily held.

The I/O port 121d is connected to at least one selected from the group of the MFCs 312, 322, 332, 512, 522, 532, and 542, the valves 314, 324, 334, 514, 524, 534, and 544, the pressure sensors 245 and 612, the APC valve 243, the vacuum pump 246, the heater 207, the temperature sensor 263, the rotator 267, the boat elevator 115, the shutter device 70, and the like.

The CPU 121a is configured to read a control program from the memory device 121c and execute the same, and is also configured to read a recipe or the like from the memory device 121c in response to an input of an operation command from the input/output device 122 or the like. The CPU 121a is configured to be capable of controlling, according to the contents of the recipe thus read, the flow rate adjustment operations for various gases by the MFCs 312, 322, 332, 512, 522, 532, and 542, the opening/closing operations of the valves 314, 324, 334, 514, 524, 534, and 544, the opening/closing operation of the APC valve 243, the pressure regulation operation by the APC valve 243 based on the pressure sensor 245, the temperature adjustment operation of the heater 207 based on temperature sensor 263, the start and stop of the vacuum pump 246, the rotation and rotation speed adjustment operation of the boat 217 by the rotator 267, the raising and lowering operation of the boat 217 by the boat elevator 115, the accommodating operation of the wafers 200 in the boat 217, the opening/closing operation of the shutter 81 in the shutter device 70, the pressure regulation operation in the internal space S based on pressure sensor 612, and the like.

The controller 121 may be configured by installing, into the computer, the above-mentioned program stored in an external memory device (e.g., a magnetic tape, a magnetic disk such as a flexible disk or a hard disk, an optical disk such as a CD or DVD, an optical magnetic disk such as an MO or the like, or a semiconductor memory such as a USB memory or a memory card) 123. Each of the memory device 121c and the external memory device 123 is configured as a non-transitory computer-readable recording medium. Hereinafter, these are collectively and simply referred to as a recording medium. As used herein, the term recording medium may include only the memory device 121c, only the external memory device 123, or both of them. The program may be provided to the computer by using a communication means such as the Internet or a dedicated line without using the external memory device 123.

(2) Substrate Processing Process

Next, as an example of a method of manufacturing a semiconductor device by forming a film on a wafer through the use of the above-described substrate processing apparatus 10 will be described as one of the semiconductor device manufacturing processes according to the present embodiment. In the following description, an operation of each part included in the substrate processing apparatus 10 is controlled by the controller 121.

Further, when the term "wafer" is used herein, it may mean "wafer itself" or "a stacked body (aggregate) of a wafer and a predetermined layer or film formed on the surface of the wafer" (That is, a wafer including a predetermined layer or film formed on the surface of the wafer may be referred to as wafer). Further, when the term "wafer surface" is used herein, it means "a surface (exposed surface) of a wafer itself" or "a surface of a predetermined layer or film formed on a wafer", i.e., "an outermost surface of a wafer as a stacked body." When the term "substrate" is used herein, it may be synonymous with the term "wafer."

(A) Film-Forming Process

A case where the substrate processing apparatus 10 is used to form a film containing a predetermined element on the wafer 200 by supplying a film-forming gas to the wafer 200 will be described. In this embodiment, the process chamber 201 in which a plurality of wafers 200 is accommodated while being supported by the boat 217 is heated at a predetermined temperature. Then, a precursor gas supply step of supplying a precursor gas containing a predetermined element as the film-forming gas to the process chamber 201 and a reaction gas supply step of supplying a reaction gas as the film-forming gas to the process chamber 201 are performed a predetermined number of times (n times).

(Wafer Loading)

A plurality of wafers 200 is loaded into the process chamber 201 (boat loading).

Specifically, when the boat 217 is charged with a plurality of wafers 200 (wafer charging), the boat 217 supporting the plurality of wafers 200 is raised by the boat elevator 115 and loaded into the process chamber 201, as shown in FIG. 2. In this state, the seal cap 219 closes the lower end opening of the manifold 209 via the O-ring 220.

(Pressure Regulation and Temperature Adjustment)

The inside of the process chamber 201 is vacuum-exhausted by the vacuum pump 246 to have a desired pressure (degree of vacuum). At this time, the pressure in the process chamber 201 is measured by the pressure sensor 245, and the APC valve 243 is feedback-controlled based on the measured pressure information (pressure regulation). The vacuum pump 246 is always kept in operation until at least processing for the wafers 200 is completed. Further, the inside of the process chamber 201 is heated by the heater 207 to have a desired temperature. At this time, the amount of electricity supplied to the heater 207 is feedback-controlled based on a temperature information detected by the temperature sensor 263 so that the inside of the process chamber 201 has a desired temperature distribution (temperature adjustment). Heating in the process chamber 201 by the heater 207 is continuously performed at least until the processing on the wafers 200 is completed.

Further, the boat 217 and the wafers 200 are rotated by the rotator 267. The rotation of the boat 217 and the wafers 200 by the rotator 267 is continued at least until the processing on the wafers 200 is completed.

(Film-Forming Step)

Thereafter, a precursor gas supply step (first gas supply step), a residual gas removal step, a reaction gas supply step (second gas supply step), and a residual gas removal step are performed a predetermined number of times in the named order.

(Precursor Gas Supply Step)

The valve 314 is opened to allow a precursor gas to flow to the gas supply pipe 310. A flow rate of the precursor gas is adjusted by the MFC 312. The precursor gas is supplied into the process chamber 201. At the same time, the valve 514 is opened to allow a carrier gas, which is the inert gas, to flow into the gas supply pipe 510. A flow rate of the carrier gas is adjusted by the MFC 512. The carrier gas is supplied into the process chamber 201 together with the precursor gas, and is exhausted from the exhaust pipe 231. Further, in order to prevent the precursor gas from entering the gas supply pipes 320 and 330 (prevent a backflow of the precursor gas), the valves 524 and 534 are opened to allow the carrier gas to flow into the gas supply pipes 520 and 530. The carrier gas is supplied to the process chamber 201 through the gas supply pipes 520 and 530, and is exhausted from the exhaust pipe 231.

At this time, the APC valve 243 is appropriately adjusted so that the pressure in the process chamber 201 becomes, a pressure in a range of 1 to 1000 Pa, preferably 1 to 100 Pa, and more preferably 10 to 50 Pa. The notation of a numerical range such as "1 to 1000 Pa" in the subject specification means that a lower limit value and an upper limit value are included in the range. Therefore, for example, "1 to 1000 Pa" means "1 Pa or more and 1000 Pa or less". The same applies to other numerical ranges.

A supply flow rate of the precursor gas controlled by the MFC 312 is, for example, a flow rate in a range of 10 to 2000 sccm, preferably 50 to 1000 sccm, and more preferably 100 to 500 sccm.

A supply flow rate of the carrier gas controlled by the MFC 512 is, for example, a flow rate in the range of 1 to 30 slm. A time for supplying the precursor gas to the wafers 200 is, for example, in a range of 1 to 60 seconds, preferably 1 to 20 seconds, and more preferably 2 to 15 seconds.

The heater 207 heats the wafers 200 so that a temperature of the wafers 200 is, for example, in a range of 200 to 600 degrees C., preferably 350 to 550 degrees C., and more preferably 400 to 550 degrees C.

As the precursor gas, for example, an Al-containing precursor (Al-containing precursor, or Al-containing gas) which is a metal-containing gas containing aluminum (Al) which is a metal element as a predetermined element is used. As the Al-containing precursor gas, for example, a halogen-based Al-containing gas such as an aluminum chloride ($AlCl_3$) gas or the like, or an organic Al-containing gas such as a trimethylaluminum (($CH_3)_3Al$, abbreviation: TMA) gas or the like may be used.

By supplying the precursor gas to the process chamber 201 under the above-mentioned conditions, a first layer is formed on the outermost surface of the wafer 200. For example, when an Al-containing gas is used as the precursor gas, an Al-containing layer is formed as the first layer. The Al-containing layer may be an adsorption layer (physisorption layer or chemisorption layer) in which an Al-containing gas or a part of the Al-containing gas is decomposed, or may be an Al deposition layer (Al layer).

(Residual Gas Removal Step)

Next, the valve 314 is closed to stop the supply of the precursor gas. At this time, the APC valve 243 is left open, the process chamber 201 is vacuum-exhausted by the vacuum pump 246, and the precursor gas unreacted or contributed to the layer formation, which remains in the process chamber 201, is removed from the process chamber 201. The valves 514, 524, and 534 are kept in an open state to maintain the supply of carrier gas to the process chamber 201.

(Reaction Gas Supply Step)

After removing the residual gas in the process chamber 201, the valve 324 is opened to allow a reaction gas to flow into the gas supply pipe 320. A flow rate of the reaction gas is adjusted by the MFC 322. The reaction gas is supplied from the gas supply pipe 320 to the wafers 200 in the process chamber 201, and is exhausted from the exhaust pipe 231. That is, the wafers 200 are exposed to the reaction gas.

At this time, the valve 524 is opened and the carrier gas flows into the gas supply pipe 520. A flow rate of the carrier gas is adjusted by the MFC 522. The carrier gas is supplied into the process chamber 201 together with the reaction gas, and is exhausted from the exhaust pipe 231. At this time, in order to prevent the reaction gas from entering the gas supply pipes 310 and 330 (prevent the backflow of the reaction gas), the valves 514 and 534 are opened to allow the carrier gas to flow into the gas supply pipes 510 and 530. The carrier gas is supplied into the process chamber 201 through the gas supply pipes 510 and 310 and the gas supply pipes 530 and 330, and is exhausted from the exhaust pipe 231.

At this time, the APC valve 243 is appropriately adjusted so that the pressure in the process chamber 201 is set to, for example, a pressure in the range of 1 to 1000 Pa. A supply flow rate of the reaction gas controlled by the MFC 322 is, for example, a flow rate in a range of 5 to 40 slm, preferably 5 to 30 slm, and more preferably 10 to 20 slm. A time for supplying the reaction gas to the wafers 200 is, for example, in a range of 1 to 60 seconds. Other processing conditions are the same as those of the precursor gas supply step described above.

As the reaction gas, a gas that reacts with the precursor gas, for example, an oxidation gas is used. As the oxidation gas, it may be possible to use an oxygen (O)-containing gas such as an oxygen ($O_2$) gas, an ozone ($O_3$) gas, a plasma-excited $O_2(O_2^*)$ gas, an $O_2$ gas+hydrogen ($H_2$) gas, a water vapor ($H_2O$ gas), a hydrogen peroxide ($H_2O_2$) gas, a nitrous oxide ($N_2O$) gas, a nitrogen monoxide (NO) gas, a nitrogen dioxide ($NO_2$) gas, a carbon monoxide (CO) gas, a carbon dioxide ($CO_2$) gas, or the like. One or more of these gases may be used as the oxidation gas.

At this time, the only gases flowing in the process chamber 201 are the reaction gas and the inert gas. The reaction gas reacts with at least a part of the first layer formed on the wafer 200 in the precursor gas supply step. That is, the Al-containing layer as the first layer formed in the precursor gas supply step is oxidized, and an aluminum oxide layer (AlO layer) containing Al and O is formed as a second layer and a metal oxide layer. That is, the Al-containing layer is modified into an AlO layer.

(Residual Gas Removal Step)

Next, the valve 324 is closed to stop the supply of the reaction gas. Then, by the same processing procedure as that of the residual gas removal step performed after the precursor gas supply step, the reaction gas unreacted or contributed to the formation of the second layer and the reaction by-products, which remain in the process chamber 201, are removed from the inside of the process chamber 201.

A cycle of sequentially performing the precursor gas supply step, the residual gas removal step, the reaction gas supply step and the residual gas removal step described above is performed a predetermined number of times (one or more times). By such a batch process (in which a plurality of steps is performed a plurality of times), the film is formed on the wafer 200. As a result, an aluminum oxide film (AlO film) as a film containing, for example, Al and O is formed on the wafer 200.

Further, in the above film-forming process, a film adheres (deposits) to the inside of the process chamber 201 (e.g., an inner wall of the process tube 203, an inner wall of the manifold 209, etc.) coming into contact with the precursor gas and the reaction gas. The film adhered to the process chamber 201 in this way may cause generation of particles (foreign substances) in the subsequent film-forming process, and may cause deterioration of a quality of the film and a device formed on the wafer 200. Therefore, in the method of manufacturing the semiconductor device according to the present embodiment, the film adhering to the inside of the process chamber 201 is removed in a cleaning process described later. The film adhering to the inside of the process chamber or the like may include not only a film including the same composition as the film formed on the wafer 200, but also by-products produced in the film-forming process.

Further, the batch process is a process in which a cycle of sequentially performing the precursor gas supply step, the residual gas removal step, the reaction gas supply step and the residual gas removal step is performed a predetermined number of times to form the film on the wafer 200. Then, in one batch, a film is formed on the wafer 200.

(After-Purging and Atmospheric Pressure Restoration)

The inert gas is supplied into the process chamber 201 from each of the gas supply pipes 510, 520 and 530, and is exhausted from the exhaust pipe 231. The inert gas acts as a purge gas, whereby the inside of the process chamber 201 is purged with the inert gas, and the gases and by-products remaining in the process chamber 201 are removed from the inside of the process chamber 201 (after-purging). Thereafter, the atmosphere in the process chamber 201 is replaced with the inert gas (inert gas replacement), and the pressure in the process chamber 201 is restored to the atmospheric pressure (atmospheric pressure restoration).

(Wafer Unloading)

Thereafter, the seal cap 219 is lowered by the boat elevator 115, and the lower end of the manifold 209 is opened. Then, the processed wafers 200 are unloaded from a lower end of the process tube 203 to the outside of the process tube 203 while being supported by the boat 217 (boat unloading). Thereafter, the processed wafers 200 are discharged from the boat 217 (wafer discharging).

(B) Cleaning Process

Next, a process (cleaning process) of etching the film adhering to the inside of the process chamber 201 in the film-forming process will be described.

(Closure by Shutter)

As shown in FIG. 1, the opening which is the lower end opening of the manifold 209 is closed by the shutter 81 in the state in which the boat 217 is unloaded from the process chamber 201. In this state, the shutter 81 closes the opening of the manifold 209 via the O-rings 82b and 83b.

(Pressure Regulation and Temperature Adjustment)

The inside of the process chamber 201 is vacuum-exhausted by the vacuum pump 246 to have a desired pressure (degree of vacuum). At this time, the pressure in the process chamber 201 is measured by the pressure sensor 245, and the APC valve 243 is feedback-controlled based on the measured pressure information (pressure regulation). The vacuum pump 246 is always kept in operation until at least the processing for the wafers 200 is completed. Further, the inside of the process chamber 201 is heated by the heater 207 to have a desired temperature. At this time, the amount of electricity supplied to the heater 207 is feedback-controlled based on the temperature information detected by the temperature sensor 263 so that the inside of the process chamber 201 has a desired temperature distribution (temperature adjustment). The heating in the process chamber 201 by the heater 207 is continuously performed at least until the etching process is completed.

(Etching (Cleaning) Process)

A process of cleaning the inside of the process chamber 201 by etching the film adhering to the inside of the process chamber 201 or the like is executed.

(Etching Step)

The valve 334 is opened to allow a cleaning gas (etching gas) to flow into the gas supply pipe 330. A flow rate of the cleaning gas is adjusted by the MFC 332. The cleaning gas is supplied from the gas supply pipe 330 into the process chamber 201, and is exhausted from the exhaust pipe 231. At the same time, the valve 534 is opened to allow the inert gas to flow into the gas supply pipe 530. A flow rate of the inert gas flowing in the gas supply pipe 530 is adjusted by the MFC 532. The inert gas is supplied into the process chamber 201 together with the cleaning gas, and is exhausted from the exhaust pipe 231. At this time, in order to prevent the cleaning gas from entering the gas supply pipes 310 and 320, the valves 514, and 524 are opened to allow the inert gas to flow into the gas supply pipes 510 and 520. The inert gas is supplied into the process chamber 201 through the gas supply pipes 310 and 320, and is exhausted from the exhaust pipe 231.

As the cleaning gas, for example, a halogen-containing gas such as a silicon tetrachloride ($SiCl_4$), hydrogen chloride (HCl), chlorine ($Cl_2$), fluorine ($F_2$), hydrogen fluoride (HF), silicon tetrafluoride ($SiF_4$), nitrogen trifluoride ($NF_3$), chlorine trifluoride ($ClF_3$), boron tribromide ($BBr_3$), silicon tetrabromide ($SiBr_4$), bromine ($Br_2$), or the like may be used. One or more of these gases may be used as the cleaning gas. In the present disclosure, if a cleaning gas that reacts with a metallic material is used, it is possible to suppress corrosion and deterioration of the surface of the shutter 81.

By supplying the cleaning gas, at least a part of the film adhering to the inside of the process chamber 201 reacts with the cleaning gas and is removed from the process chamber 201. For example, when a SiCl$_4$ gas is used as the cleaning gas, due to a supply of the SiCl$_4$ gas, at least a part of the AlO film adhering to the process chamber 201 reacts with the SiCl$_4$ gas and is removed from the process chamber 201.

At this time, the heater 207 is controlled by the controller 121 to heat the inside of the process chamber 201 to a predetermined temperature in a range of, for example, 200 to 800 degrees C., preferably 400 to 650 degrees C. to activate the cleaning gas. At this time, the APC valve 243 is closed or substantially closed to an extent that the process is not affected, and the cleaning gas is contained in the process chamber 201. By containing the cleaning gas, it is possible to reduce an influence of the above-mentioned reaction delay on the etching. Then, the pressure in the process chamber 201 is maintained at a first pressure, for example, a predetermined pressure in a range of 1 to 40,000 Pa, preferably 10,000 to 30,000 Pa, and more preferably 20,000 to 30,000 Pa. A supply flow rate of the cleaning gas controlled by the MFC 332 is set to, for example, a flow rate in a range of 1 to 10 slm, preferably 3 to 8 slm. A time for supplying the cleaning gas to the process chamber 201 is set to, for example, a time in a range of 60 to 600 seconds.

At this time, the valve 544 is opened to allow the inert gas to flow into the gas supply pipe 540. A flow rate of the inert gas is adjusted by the MFC 542. The inert gas is supplied from the gas supply pipe 540 into the internal space S. The inert gas supplied into the internal space S flows into the reaction container through the first seal 605 due to the pressure difference between the pressure in the process chamber 201 and the pressure in the internal space S. The inert gas flowing into the reaction container is exhausted from the exhaust pipe 231.

That is, in the state in which the opening of the manifold 209 is closed by the shutter 81, the inert gas is supplied to the internal space S formed between the surfaces of the shutter 81 and the plate 600 facing each other. In other words, the cleaning gas is supplied into the process chamber 201 while the inert gas is supplied to the internal space S.

That is, the controller 121 controls the cleaning gas supply system and the inert gas supply system 700 to supply the inert gas from the inert gas supply system 700 into the internal space S while supplying the cleaning gas from the cleaning gas supply system into the process chamber 201.

At this time, the controller 121 controls the inert gas supply system 700 so that the pressure in the internal space S is controlled based on the pressure detected by the pressure sensor 612 to become a pressure at which the inert gas supplied in the internal space S flows into the process chamber 201 through the O-ring 605b. That is, the pressure in the internal space S is controlled to become higher than the pressure in the process chamber 201 to which the cleaning gas is supplied, by controlling the cleaning gas supply system, the inert gas supply system 700, and the exhaust system with the controller 121. Specifically, the cleaning gas supply system, the inert gas supply system 700, and the exhaust system are controlled by the controller 121 such that the pressure in the internal space S becomes higher by, for example, 100 Torr or more than the pressure in the process chamber 201 to which the cleaning gas is supplied.

In this regard, if the pressure in the internal space S is higher, it becomes easier to suppress the entry of the cleaning gas into the internal space S, however, if the pressure in the internal space S is too high as compared with the pressure in the process chamber 201, the plate 600 may be damaged. Specifically, if the inside/outside pressure difference, which is the difference between the pressure in the internal space S and the pressure in the process chamber 201, is less than 100 Torr, it may not be possible to prevent the cleaning gas from entering the internal space S. On the other hand, if the inside/outside pressure difference is too large, the plate 600 may be damaged depending on the mechanical strength of the plate 600. Therefore, the cleaning gas supply system, the inert gas supply system 700, and the exhaust system are controlled so that the pressure in the internal space S is less than the pressure at which the plate 600 is damaged by the inside/outside pressure difference. For example, when the plate 600 is formed of a quartz plate having a thickness of 50 mm or less, the inside/outside pressure difference is preferably set to 200 Torr or less in order to avoid damage to the plate 600. At this time, since the wire diameter of the O-ring 605b is smaller than the wire diameter of the O-rings 82b and 83b and the crushing rate of the O-ring 605b is smaller than the crushing rate of the O-rings 82b and 83b, the inert gas supplied to the internal space S is allowed to flow into the reaction container without being blocked. By allowing the inert gas to flow out from the internal space S in this way, it is possible to prevent the cleaning gas from entering the internal space S. The pressure in the internal space S is preferably selected according to the material and thickness of the plate 600.

(Residual Gas Removal Step)

After supplying the cleaning gas to the process chamber 201 for a predetermined time, the valve 334 is closed to stop the supply of the cleaning gas. The APC valve 243 is opened if the APC valve 243 is closed or substantially closed to the extent that the process is not affected. Then, the cleaning gas unreacted or contributed to the removal of the film, which remains in the process chamber 201, is removed from the inside of the process chamber 201 by the same processing procedure as that of the residual gas removal step in the film-forming process described above. At this time, the inert gas is continuously supplied from the inert gas supply system 700.

(Perform a Predetermined Number of Times)

The film adhering to the inside of the process chamber 201 is removed by performing a cycle in which the above steps are sequentially performed once or more (a predetermined number of times (m times)). The above cycle is preferably repeated multiple times.

According to the present disclosure, it is possible to prevent the cleaning gas from coming into contact with the surface of the shutter and to suppress corrosion and deterioration of the surface of the shutter. Further, the inert gas can be supplied to the movable shutter 81, and the corrosion of the metal-made shutter can be suppressed.

(3) Modification

Figure 8:
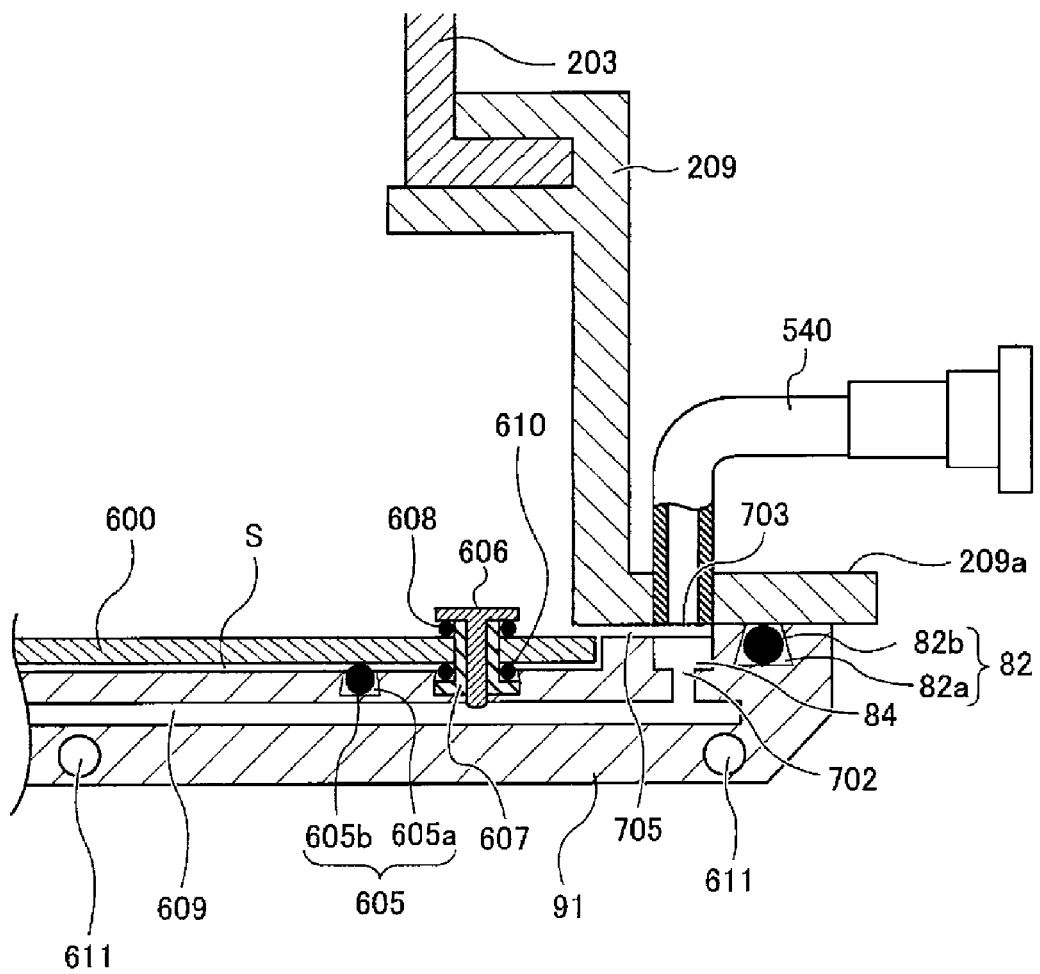
FIG. 8 is a vertical sectional view showing a modification of the lid.

Next, a modification of the shutter 81 will be described with reference to FIG. 8. In this modification, those parts different from the above-described embodiment will be particularly described.

A gap 705 that brings the annular groove 84 and the space inside the reaction container into communication with each other in a state in which the shutter 91 and the lower flange 209a are in contact with each other, i.e., in the state in which the opening is closed by the shutter 91, is installed between the shutter 91 and the lower flange 209a. That is, in this modification, the O-ring 82b is installed at an outer peripheral side of the annular groove 84 of the shutter 91, however, an O-ring is not installed at an inner peripheral side of the annular groove 84. That is, the inert gas is supplied into the reaction container (i.e., the inside of the process tube 203 and the manifold 209) through the gap 705 without sealing the inner peripheral side of the annular groove 84. Thus, the inert gas supplied from the gas supply pipe 540 is supplied from the first gas supply port 604 to the internal space S through the second gas supply port 703, the annular groove 84, the gas introduction port 702, and the gas flow path 609, and is supplied into the process chamber 201 through the second gas supply port 703, the annular groove 84, and the gap 705. As a result, the flow of the inert gas from the contact surface in contact with the lower flange 209a into the reaction container can be formed to suppress the entry of the cleaning gas into the contact surface and to prevent the metal-made shutter 91 from coming into contact with the cleaning gas.

Further, the plate 600 is installed so that in the state in which the opening is closed by the shutter 91, the outer peripheral end of the plate 600 is located outside an inner periphery of the manifold 209 and an inner periphery of the opening end, when viewed from the center of the manifold 209. As a result, a flowing-around of the cleaning gas from the inside of the reaction container to the outer peripheral end of the plate 600 can be reduced by the flow of the inert gas from the contact surface in contact with the lower flange 209a into the reaction container. This makes it possible to prevent the surface of the shutter 91 exposed outside the outer peripheral end of the plate 600 from coming into contact with the cleaning gas.

Next, a modification of the plate 600 will be described with reference to FIGS. 9A to 9D.

Figure 9A:
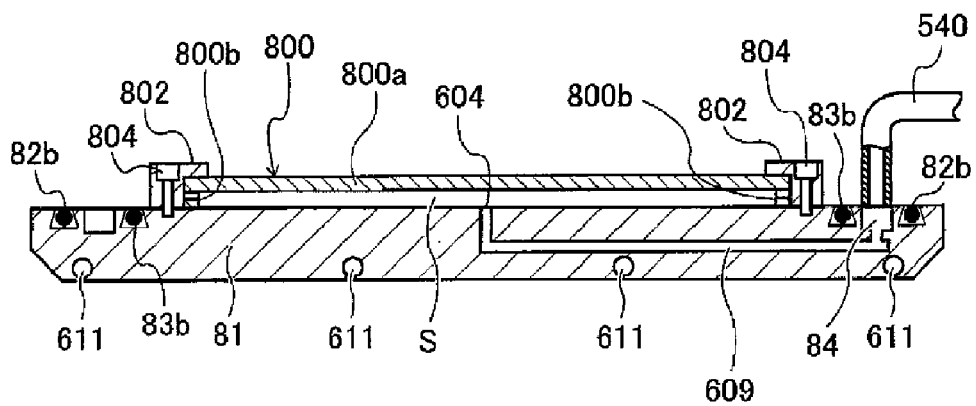
FIG. 9A is a diagram showing a modification of the protector.
Figure 9B:
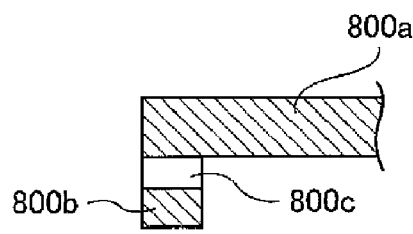
FIG. 9B is a diagram showing surroundings of an end of the protector in FIG. 9A.
Figure 9C:
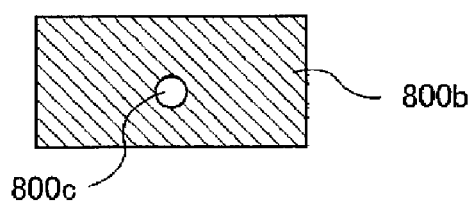
FIG. 9C is a diagram of the surroundings of FIG. 9B viewed from a circumferential direction.

The plate 800 according to this modification includes a circular upper surface 800a and a side surface 800b continuously installed around the upper surface 800a. The internal space S is formed (defined) by the upper surface 800a, the side surface 800b, and the shutter 81. The side surface 800b is formed with a through-hole 800c that communicates between the internal space S and the space in the reaction container (i.e., in the process tube 203 and the manifold 209). That is, the through-hole 800c is configured to allow the inert gas supplied to the internal space S to flow into the process chamber 201. As shown in FIG. 9C, the through-hole 800c is formed in a circular shape and is configured to bring the internal space S into communication with the inside of the process chamber 201. In this way, the inert gas in the internal space S can be allowed to flow into the process furnace through the through-hole 800c.

Further, the outer peripheral end of the plate 800, i.e., the side surface 800b of the plate 800, is fixed by a fixing member 804 via a holder 802. As a result, the plate 800 is fixed to the shutter 81 in a state in which the internal space S is formed.

Figure 9D:
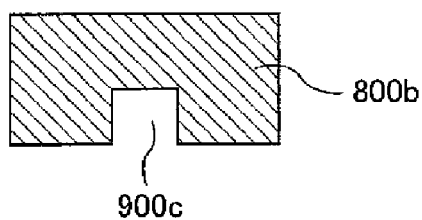
FIG. 9D is a diagram showing a modification of FIGS. 9A to 9C.

Further, a shape of the through-hole 800c that brings the internal space S into communication with the inside of the furnace is not limited to the circular shape shown in FIG. 9C, and may be a square shape with the lower portion cut out just like the through-hole 900c shown in FIG. 9D. Further, the through-hole is not limited to one, and a plurality of through-holes may be installed in the side surface 800b. Thus, the pressure in the internal space S can be adjusted in addition to the above-mentioned flow of the inert gas through the O-ring 605b or without the flow of the inert gas through the O-ring 605b.

In the above-described embodiment, the case where the first seal 605 that seals the gap between the shutter 81 and the plate 600 is installed on the upper surface of the shutter 81 has been described, however, the present disclosure is not limited thereto. A first seal 605 may be installed on the surface of the plate 600 facing the shutter 81. That is, a dovetail groove 605a may be formed on the surface of the plate 600 facing the shutter 81, and an O-ring 605b may be installed in the dovetail groove 605a. That is, the O-ring 605b may be installed along the outer periphery of the plate 600 over the entire circumference of the plate 600.

Further, a groove in which the O-ring 605b is installed is not limited to the dovetail groove 605a, and may be a groove having another shape, such as a square groove, an L-shaped groove, or the like.

Further, in the above-described embodiment, the case where the second seal 82 and the third seal 83 are installed on the contact surface of the shutter 81 in contact with the lower flange 209a has been described, however, the present disclosure is not limited thereto. A second seal 82 and a third seal 83 may be installed on the contact surface of the lower flange 209a of the manifold 209 in contact with the shutter 81.

Further, in the above-described embodiment, the case where the annular groove 84 is installed on the contact surface of the shutter 81 in contact with the lower flange 209a has been described, however, the present disclosure is not limited thereto. An annular groove 84 may be provided on the contact surface of the lower flange 209a in contact with the shutter 81.

Further, in the above-described embodiment, the case where the first gas supply port 604 communicating with the internal space S is provided substantially at the center of the surface of the shutter 81 facing the internal space S has been described, however, the present disclosure is not limited thereto. A first gas supply port 604 is not limited to substantially the center of the shutter 81, and may be provided at any position communicating with the internal space S between the shutter 81 and the plate 600, and the O-ring 605b. Further, the number of first gas supply ports 604 is not limited to one, and a plurality of first gas supply ports 604 may be provided.

Further, in the above-described embodiment, the case where the refrigerant flow path 611 that cools the shutter 81 and the surroundings of the shutter 81 is installed inside the shutter 81 has been described, however, the present disclosure is not limited thereto. A pipe through which the refrigerant flows may be installed on a lower surface of the shutter 81 to cool the shutter 81 and the surroundings of the shutter 81 from the lower surface of the shutter 81.

Further, in the above-described embodiment, the case where the plate 600 is made of quartz or SiC as the first non-metallic material has been described as an example, however, the present disclosure is not limited thereto. The plate 600 may be a plate, at least a surface of which is composed of a metallic material coated with a first non-metallic material. By using the plate, at least the surface of which is coated with the first non-metallic material, it is possible to suppress corrosion due to the cleaning gas while increasing the mechanical strength of the plate 600. As the plate, for example, a metallic material sprayed with silicon (Si) or coated with yttrium oxide ($Y_2O_3$) or aluminum nitride (AlN), which is the first non-metallic material, may be used.

Further, in the above-described embodiment, the example in which the AlO film is formed on the wafer 200 and the AlO film deposited inside the furnace is etched (removed) by using the cleaning gas has been described, however, the types of the films are not particularly limited in the present disclosure. Further, the types of the gases used in the film-forming process, such as the precursor gas, the reaction gas, and the like, are not particularly limited.

Further, in the above-described embodiment, the example in which the shutter 81 and its surrounding structure are cleaned in the cleaning step using the cleaning gas has been described. However, the present disclosure is not limited to the cleaning step using the cleaning gas, and the structure (i.e., the shutter 81 and its surrounding structure) may also be applied in a process using a gas having reactivity with a metallic material. Even in that case, it is possible to prevent the reaction gas from coming into contact with the surface of the lid containing a metallic material and to suppress corrosion and deterioration of the lid surface.

The process recipe (program that describes processing procedures, processing conditions, etc.) used for forming these various thin films is preferably individually prepared (prepared in multiple numbers) according to the contents of the substrate processing process, the cleaning process, and the like (the film type, composition ratio, film quality, film thickness, etc. of the thin film to be formed, the processing procedure, the processing conditions, etc.). Then, when starting the substrate processing process, the cleaning process, and the like, a process recipe, a cleaning recipe, or the like may be preferably appropriately selected from a plurality of process recipes, a plurality of cleaning recipes, or the like according to the contents of the substrate processing process, the cleaning process, or the like. Specifically, a plurality of process recipes, a plurality of cleaning recipes, or the like individually prepared according to the contents of the substrate processing process, the cleaning processing, or the like is preferably stored (installed) in the memory device 121*c* of the substrate processing apparatus in advance via a telecommunication line or a recording medium (external memory device 123) that records the process recipes, the cleaning recipes, or the like. Then, when starting the substrate processing process, the CPU 121*a* of the substrate processing apparatus may preferably appropriately select a process recipe, a cleaning recipe, or the like from the plurality of process recipes, the plurality of cleaning recipes, or the like stored in the memory device 121*c* according to the contents of the substrate processing process. With this configuration, it becomes possible to form thin films of various film types, composition ratios, film qualities and film thicknesses with a single substrate processing apparatus in a versatile and reproducible manner. In addition, the operation load of the operator (input load of processing procedures, processing conditions, etc.) can be reduced, and the substrate processing process can be started quickly while avoiding operation mistakes.

Further, the present disclosure can also be realized by changing, for example, a process recipe, a cleaning recipe, or the like of an existing substrate processing apparatus. When changing the process recipe, the cleaning recipe, or the like, the process recipe, the cleaning recipe, or the like according to the present disclosure may be installed on the existing substrate processing apparatus via a telecommunications line or a recording medium on which the process recipe, the cleaning recipe, or the like is recorded. Alternatively, it is also possible to operate the input/output device of the existing substrate processing apparatus to change the process recipe, the cleaning recipe, or the like thereof to the process recipe, the cleaning recipe, or the like according to the present disclosure.

One embodiment of the present disclosure and the modifications thereof have been specifically described above. However, the present disclosure is not limited to the above-described embodiment and the modifications. Various changes may be made without departing from the gist thereof.

According to the present disclosure in some embodiments, it is possible to provide a technique capable of preventing a cleaning gas from coming into contact with a surface of a lid containing a metallic material, and suppressing generation of corrosion or deterioration of the surface of the lid.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
a reaction container configured to process a substrate;
a cleaning gas supply system configured to supply a cleaning gas into the reaction container;
a lid configured to be capable of closing an opening of the reaction container and made of a metallic material;
a protector installed over a surface of the lid at a side facing an inside of the reaction container and including a surface made of a first non-metallic material;
an internal space formed between surfaces of the lid and the protector facing each other; and
an inert gas supply system configured to supply an inert gas to the internal space in a state in which the opening is closed by the lid,
wherein at least one selected from the group of the lid and the protector includes a first seal configured to seal a first gap between the lid and the protector with a first gasket, and
wherein the internal space includes a first space surrounded by the surfaces of the lid and the protector facing each other, and the first seal.

2. The apparatus of claim 1, wherein the first seal is installed along an outer periphery of the protector over an entire circumference of at least one selected from the group of the lid and the protector.

3. The apparatus of claim 1, wherein the inert gas supply system is configured to supply the inert gas to the internal space through a first gas supply port installed on the surface of the lid facing the internal space.

4. The apparatus of claim 3, wherein the lid includes:
a gas introduction port installed at a contact surface in contact with an opening end of the reaction container; and
a gas flow path configured to connect the gas introduction port and the first gas supply port to communicate with each other,
wherein the reaction container includes a second gas supply port installed at the contact surface in contact with the lid, and
wherein the second gas supply port and the gas introduction port are arranged so that the second gas supply port and the gas introduction port communicate with each other in the state in which the opening of the reaction container is closed.

5. The apparatus of claim 4, wherein at least one selected from the group of the lid and the opening end includes a groove installed along an outer periphery of the lid facing the contact surface, and
wherein the second gas supply port is connected to the gas introduction port via the groove in the state in which the opening is closed by the lid.

6. The apparatus of claim 5, wherein at least one selected from the group of the lid and the opening end includes a second seal installed along the outer periphery of the lid and configured to seal the contact surface by a second gasket in the state in which the opening is closed by the lid, and
  wherein the groove is installed inside the second seal when viewed from a center of the reaction container.

7. The apparatus of claim 6, wherein a second gap is installed between the lid and the opening end of the reaction container to bring the groove and a second space in the reaction container into communication with each other in the state in which the opening is closed by the lid.

8. The apparatus of claim 7, wherein the protector is installed so that an outer peripheral end of the protector is located outside an inner periphery of the opening end when viewed from the center of the reaction container, in the state in which the opening is closed by the lid.

9. The apparatus of claim 1, wherein an opening end of the reaction container is provided by a manifold.

10. The apparatus of claim 1, wherein the protector is secured to the lid by at least one selected from the group of a screw and a bolt.

11. The apparatus of claim 10, wherein the screw is made of a second non-metallic material.

12. The apparatus of claim 1, further comprising:
  a controller configured to be capable of controlling the cleaning gas supply system and the inert gas supply system to supply the inert gas from the inert gas supply system into the internal space while supplying the cleaning gas into the reaction container from the cleaning gas supply system.

13. The apparatus of claim 12, further comprising:
  an exhaust system configured to exhaust the inside of the reaction container,
  wherein the controller is configured to be capable of controlling the cleaning gas supply system, the inert gas supply system, and the exhaust system so that a pressure in the internal space is higher than a pressure in the reaction container to which the cleaning gas is supplied.

14. The apparatus of claim 1, further comprising:
  a refrigerant flow path installed inside the lid or on a lower surface of the lid.

15. The apparatus of claim 1, wherein the protector is made of at least one selected from the group of quartz and silicon carbide.

16. The apparatus of claim 1, wherein the protector is made of a metallic material whose surface is coated with the first non-metallic material.

17. A cleaning method, comprising:
  closing an opening of a reaction container configured to process a substrate, with a lid made of a metallic material;
  supplying an inert gas to an internal space formed between surfaces of the lid and a protector facing each other, the protector installed over a surface of the lid at a side facing an inside of the reaction container and including a surface composed of a first non-metallic material, in a state in which the opening is closed by the lid; and
  supplying a cleaning gas into the reaction container in a state in which the inert gas is supplied to the internal space.

18. A method of manufacturing a semiconductor device, comprising:
  forming a film on a substrate by supplying a film-forming gas into a reaction container in which the substrate is accommodated;
  unloading the substrate on which the film is formed from an inside of the reaction container; and
  performing the cleaning method of claim 17 after the substrate is unloaded from the inside of the reaction container.

* * * * *